(12) United States Patent
Tangudu et al.

(10) Patent No.: US 9,935,645 B1
(45) Date of Patent: Apr. 3, 2018

(54) ANALOG-TO-DIGITAL CONVERTER NON-LINEARITY CORRECTION USING COEFFICIENT TRANSFORMATION

(71) Applicant: TEXAS INSTRUMENTS INCORPORATED, Dallas, TX (US)

(72) Inventors: Jawaharlal Tangudu, Bangalore (IN); Chandrasekhar Sriram, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/674,175

(22) Filed: Aug. 10, 2017

(30) Foreign Application Priority Data

Oct. 5, 2016  (IN) .............................. 201641034098

(51) Int. Cl.
*H03M 1/12* (2006.01)
*H03M 1/08* (2006.01)

(52) U.S. Cl.
CPC ........... *H03M 1/08* (2013.01); *H03M 1/0836* (2013.01); *H03M 1/0854* (2013.01)

(58) Field of Classification Search
CPC ..... H03M 1/08; H03M 1/0854; H03M 1/0836
USPC ................................................. 341/155, 120
See application file for complete search history.

(56) References Cited

U.S. PATENT DOCUMENTS

| | | | |
|---|---|---|---|
| 5,361,067 A * | 11/1994 | Pinckley | ............. H03M 1/1052 341/120 |
| 7,142,137 B2 | 11/2006 | Batruni | |
| 7,199,736 B2 | 4/2007 | Batruni | |
| 7,978,104 B2 | 7/2011 | Johannson | |
| 8,825,415 B2 | 9/2014 | Johannson | |
| 8,952,835 B1 * | 2/2015 | Zortea | .................. H03M 1/0809 341/118 |
| 8,981,972 B2 * | 3/2015 | Shen | ....................... H03M 1/38 341/118 |
| 9,041,571 B2 * | 5/2015 | Wang | ...................... H03M 1/12 341/118 |
| 2009/0058521 A1 | 3/2009 | Fernandez | |

OTHER PUBLICATIONS

Hu, Xiao et al. State-of-the-Art in Volterra Series Modeling for ADC Nonlinearity, IEEE, Second Asis International Conference on Modeling & Simulation, May 2008 (6 pages).

* cited by examiner

*Primary Examiner* — Brian Young
(74) *Attorney, Agent, or Firm* — John R. Pessetto; Charles A. Brill; Frank D. Cimino

(57) ABSTRACT

Circuitry for correcting non-linearity of an analog-to-digital converter. A non-linearity correction system for an analog-to-digital converter (ADC) includes coefficient storage, coefficient transformation circuitry, and correction circuitry. The coefficient storage is encoded with a first set of coefficients for correcting non-linearity of the ADC at a first sampling rate. The coefficient transformation circuitry is coupled to the coefficient storage. The coefficient transformation circuitry is configured to generate a second set of coefficients for correcting non-linearity of the ADC at a different sampling rate. The correction circuitry is configured to apply the second set of coefficients to correct non-linearity in output of the ADC while the ADC is operating at the different sampling rate.

18 Claims, 3 Drawing Sheets

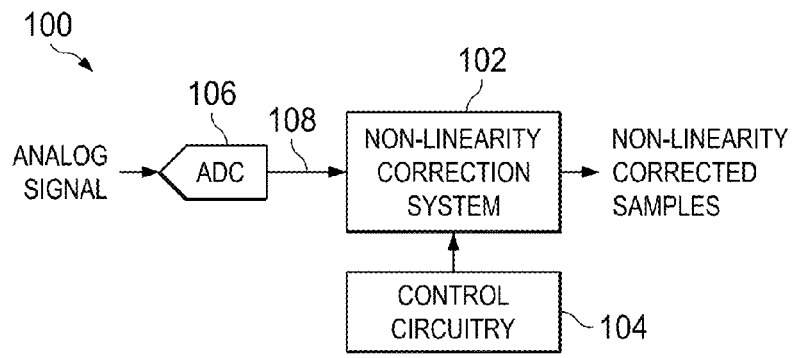
FIG. 1
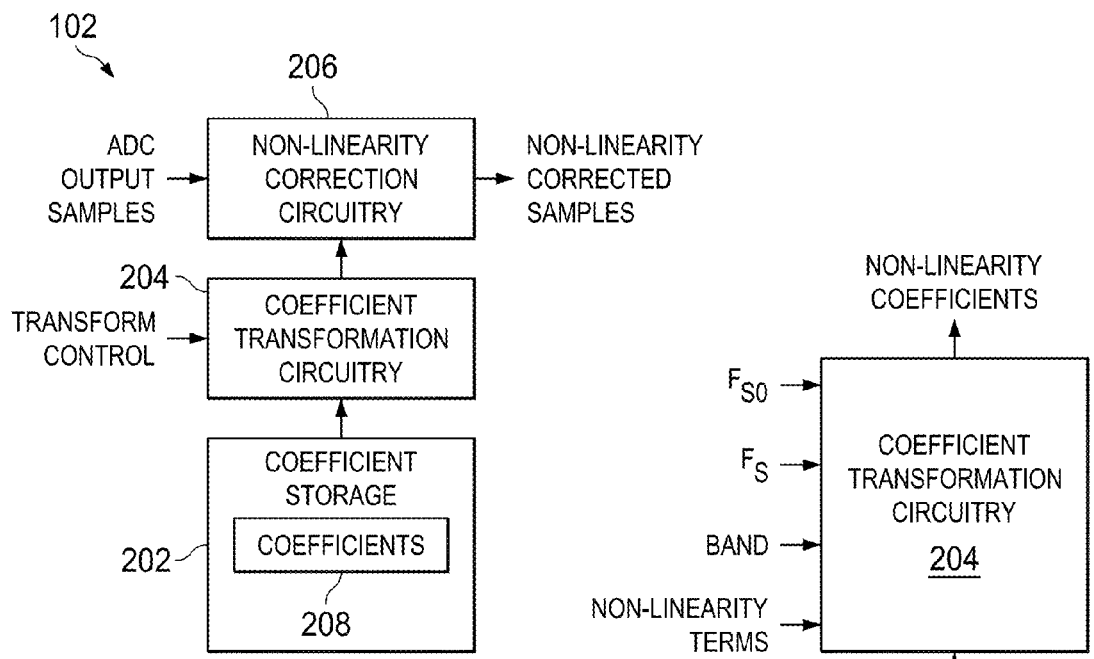
FIG. 2
FIG. 3
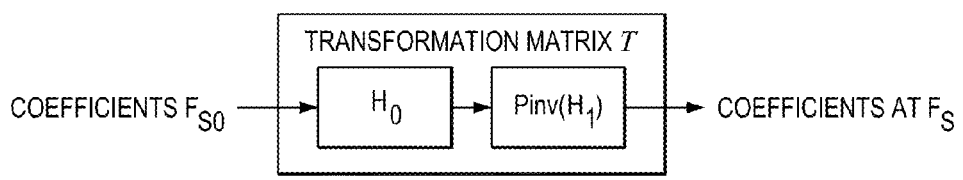
FIG. 4

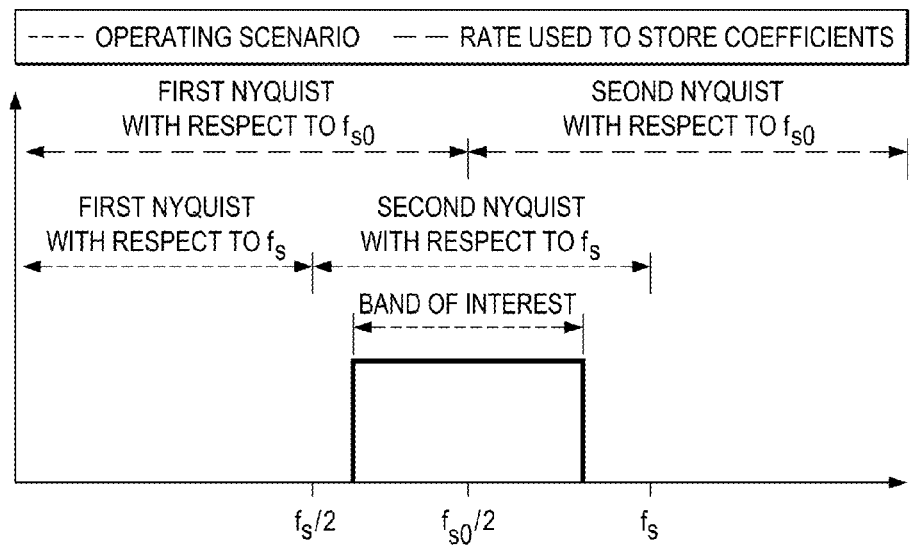
FIG. 5
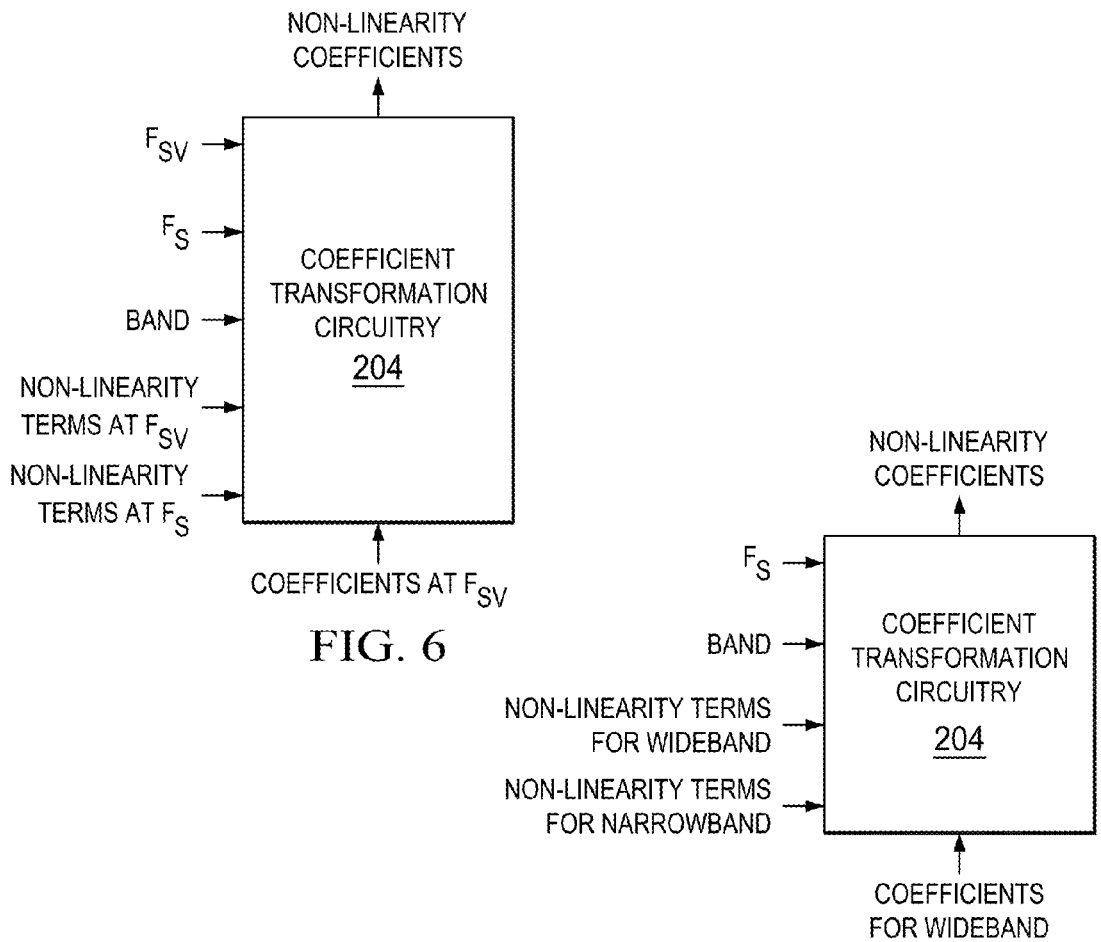
FIG. 6
FIG. 7

ANALOG-TO-DIGITAL CONVERTER NON-LINEARITY CORRECTION USING COEFFICIENT TRANSFORMATION

CROSS-REFERENCE TO RELATED APPLICATIONS

The present application claims priority to Indian Provisional Patent Application No. 201641034098, filed Oct. 5, 2016, titled "Non Linearity Corrector Coefficient Transformation," which is hereby incorporated herein by reference in its entirety.

BACKGROUND

An analog-to-digital converter (ADC) is a circuit that converts a continuous time signal (e.g., a voltage or current) into a discrete time representation that is proportional in magnitude to the continuous time signal ADCs are used for signal measurement in a variety of electronics systems, such as mobile phones, audio and video equipment, wireline communications systems, measurement equipment, and radar systems. Various error sources affect ADC performance. For example, ADCs of all types may suffer from quantization error, non-linearity, and/or clock jitter.

SUMMARY

Circuitry for correcting non-linearity of an analog-to-digital converter (ADC) is disclosed herein. In one embodiment, a non-linearity correction system for an ADC includes coefficient storage, coefficient transformation circuitry, and correction circuitry. The coefficient storage is encoded with a first set of coefficients for correcting non-linearity of the ADC at a first sampling rate. The coefficient transformation circuitry is coupled to the coefficient storage. The coefficient transformation circuitry is configured to generate a second set of coefficients for correcting non-linearity of the ADC at a different sampling rate. The correction circuitry is configured to apply the second set of coefficients to correct non-linearity in output of the ADC while the ADC is operating at the different sampling rate.

In another embodiment, analog-to-digital conversion circuitry includes an ADC and a non-linearity correction circuit coupled to an output of the ADC. The non-linearity correction circuit includes coefficient storage, coefficient transformation circuitry, and correction circuitry. The coefficient storage is encoded with a first set of coefficients for correcting non-linearity of the ADC at a first sampling rate. The coefficient transformation circuitry is coupled to the coefficient storage. The coefficient transformation circuitry is configured to retrieve the first set of coefficients from the coefficient storage, and to process the first set of coefficients to generate a second set of coefficients for correcting non-linearity of the ADC at a second sampling rate. The correction circuitry is configured to apply the second set of coefficients to correct non-linearity in output of the ADC while the ADC is operating at the second sampling rate.

In a further embodiment, a circuit for correcting non-linearity of an ADC includes coefficient storage, coefficient transformation circuitry, and correction circuitry. The coefficient storage encoded with a first set of coefficients for correcting non-linearity of the ADC at a first sampling rate and for a first bandwidth of ADC output signal. The coefficient transformation circuitry is coupled to the coefficient storage. The coefficient transformation circuitry is configured to multiply the first set of coefficients by a transformation matrix to generate a second set of coefficients for correcting non-linearity of the ADC at a second sampling rate and for a second bandwidth of ADC output signal. The correction circuitry is configured to apply the second set of coefficients to correct non-linearity in output of the ADC while the ADC is operating at the second sampling rate and with the second bandwidth of ADC input signal.

BRIEF DESCRIPTION OF THE DRAWINGS

For a detailed description of various examples, reference will now be made to the accompanying drawings in which:

FIG. 1 shows a block diagram of a digitization system that includes digital non-linearity correction in accordance with various embodiments;

FIG. 2 shows a block diagram of a non-linearity correction system in accordance with various embodiments;

FIG. 3 shows coefficient transformation circuitry in accordance with various embodiments;

FIG. 4 shows composition of a transformation matrix and application of the transformation matrix to generate non-linearity correction coefficients in accordance with various embodiments;

FIG. 5 shows a band of interest spanning multiple Nyquist zones with respect to a sampling rate ($f_{so}$) corresponding to stored non-linearity coefficients;

FIGS. 6 and 7 show coefficient transformation circuitry in accordance with various embodiments;

DETAILED DESCRIPTION

Figure 8:
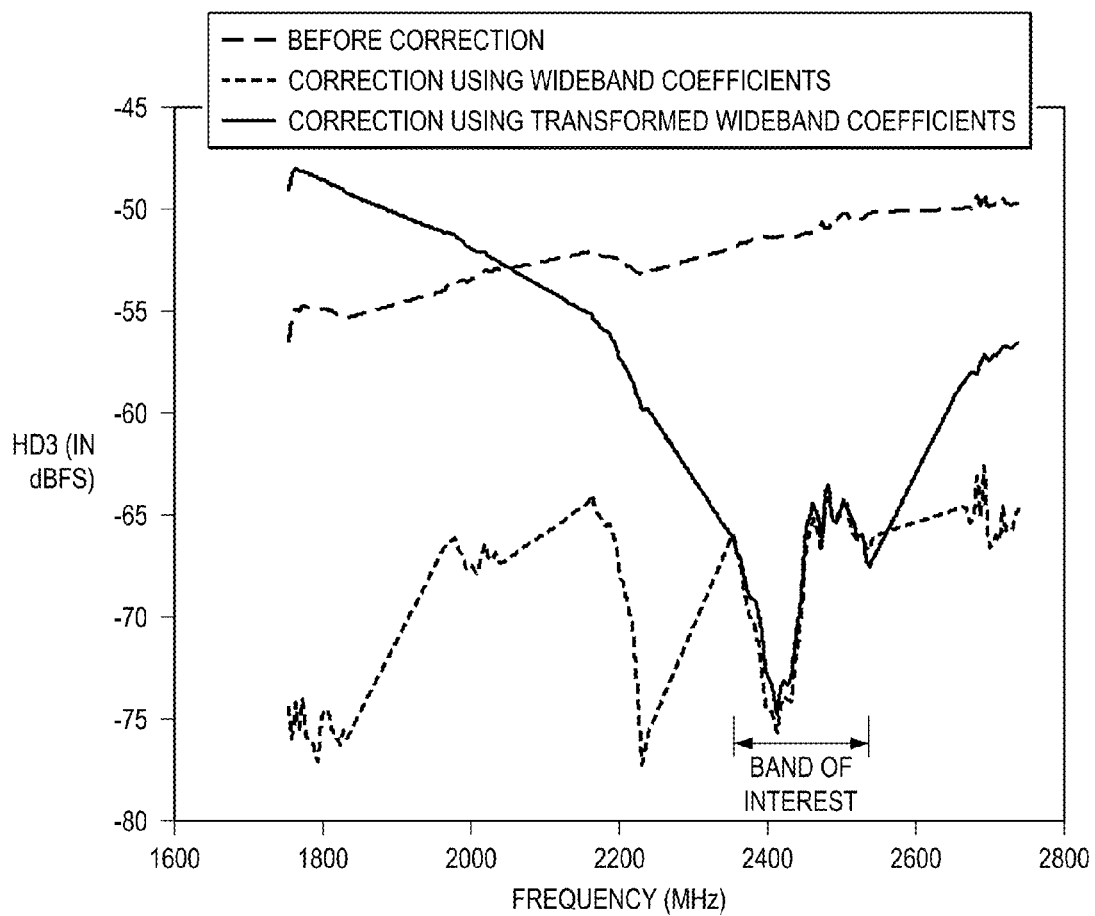
FIG. 8 shows third harmonic distortion performance using a non-linearity correction system in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of additional factors.

In some applications, analog-to-digital converters (ADCs) must meet stringent harmonic distortion and/or intermodulation distortion specifications. For example, ADCs used in wireless infrastructure must meet strict third harmonic distortion and intermodulation distortion requirements to conform to cellular system standards. Harmonic distortion (e.g., third harmonic distortion) and intermodulation distortion of an ADC can be improved by applying a factory calibrated digital non-linearity correction to the output of the ADC. Because an ADC may operate over a wide range of sampling rates, and good non-linearity performance must be provided for all sampling rates, in some non-linearity correction systems, non-linearity correction coefficients may be provided for each supported sampling rate, and stored in memory. Unfortunately, the amount of memory required to store the coefficients increases linearly with the number of sampling rates. Consequently, such non-linearity correction systems may support only a few sampling rates.

Embodiments of the non-linearity correction system disclosed herein store non-linearity coefficients for one sampling rate and transform the coefficients for use with any sampling rate at which an ADC operates. The non-linearity correction system may apply matrix multiplication to transform the non-linearity coefficients. Accordingly, the memory dedicated to storage of non-linearity coefficients may be reduced and the number of sampling rates supported is not limited by the number of stored coefficient sets. Furthermore, because fewer coefficients are required for non-linearity correction in a narrow band than are required in a wide band, embodiments may reduce the number of coefficients applied in non-linearity correction as a function of bandwidth, and reduce the power consumed by non-linearity correction.

FIG. 1 shows a block diagram of a digitization system 100 that includes digital non-linearity correction in accordance with various embodiments. The system 100 includes an ADC 106, a non-linearity correction system 102 and control circuitry 104. The ADC 106 receives an analog signal as input and converts the analog signal to a stream of digital values (digital samples) 108. The ADC 106 may be a direct-conversion ADC, successive approximation ADC, or any other type of ADC. The ADC 106 may support multiple sampling frequencies (i.e., sampling rates). The digital samples produced by the ADC 106 are provided to the non-linearity correction system 102.

The non-linearity correction system 102 processes the digital samples 108 received from the ADC 106 to correct the digital samples for non-linearity of the ADC 106. Some embodiments of the non-linearity correction system 102 may apply a third order non-linearity correction model using both Volterra terms and derivative signal as:

$$y(n) = x\left(n - \frac{L}{2}\right) + y_3(n) + d_3(n) \quad (1)$$

$$x_d(n) = x'(n) \Rightarrow \text{Derivative Signal}$$

$$y_3(n) = \sum_{k_1=0}^{L} \sum_{k_2=k_1}^{L} \sum_{k_3=k_2}^{L} c_3(k_1, k_2, k_3) x(n-k_1) x(n-k_2) x(n-k_3)$$

$$d_3(n) = \sum_{k_1=0}^{L} c_{3,1}(k_1) x^2(n-k_1) x_d\left(n - \frac{L}{2}\right) +$$

$$\sum_{k_1=0}^{L} c_{3,2}(k_1) x(n-k_1) x_d\left(n - \frac{L}{2}\right)^2 + c_{3,3} x_d\left(n - \frac{L}{2}\right)^3$$

where:
x(n) is the input to the non-linearity correction system 102 (i.e., the output of the ADC 106;
y(n) is the output of the non-linearity correction system 102 (i.e., non-linearity corrected samples);
L is memory order; and
$k_1$, $k_2$, and $k_3$ are temporary index variables.

In the correction equations above, the main input signal x(n) is added with 3rd order non-linearity correction terms $y_3(n)$ and $d_3(n)$. $y_3(n)$ is a standard Volterra model based term and $d_3(n)$ has $3^{rd}$ order terms using both the derivative signal and main signal. $c_3(k_1,k_2,k_3)$, $c_{3,1}(k_1)$, $c_{3,2}(k_1)$, $c_{3,3}$, are coefficients in this non-linearity correction model. The values of the coefficients are programmed based on the ADC sampling rate. Similar equations can be written for second order, fourth order or any other order non-linearity terms, and may use standard Volterra terms and other non-linearity terms.

Embodiments of the non-linearity correction system 102 may apply more or fewer terms than are shown in equation (1) as needed to correct non-linearity of a given set of digital samples 108. The coefficients applied to correct non-linearity in the digital samples 108 may be derived, by the non-linearity correction system 102, from a single set of non-linearity coefficients stored in the non-linearity correction system 102. The non-linearity correction system 102 may derive non-linearity coefficients for any sampling rate supported by the ADC 106 from the single set of non-linearity coefficients.

The control circuitry 104 generates control signals and information that the non-linearity correction system 102 applies to generate the coefficients applied to the digital samples 108 from the single set of coefficients stored in the non-linearity correction system 102. For example, the control circuitry 104 may communicate the sampling rate at which the ADC 106 is operating, information concerning the bandwidth of signal to be corrected for non-linearity, and other information to the non-linearity correction system 102. The non-linearity correction system 102 applies the information to generate the coefficients applied to reduce non-linearity in the digital samples 108.

Some embodiments of the system 100 may include multiple instances of the ADC 106, where each ADC 106 has different non-linearity performance. Because the coefficients applied to correct non-linearity in the digital samples generated by the ADCs 106 may be derived, by the non-linearity correction system 102, from a single set of non-linearity coefficients stored in the non-linearity correction system 102, the storage requirements of the non-linearity system 102 may be reduced relative to a system that stores non-linearity coefficients for each ADC 106 at each sampling frequency.

FIG. 2 shows a block diagram of the non-linearity correction system 102 in accordance with various embodiments. The non-linearity correction system 102 includes coefficient storage 202, coefficient transformation circuitry 204, and non-linearity correction circuitry 206. The coefficient storage 202 stores a single set of non-linearity correction coefficients 208. The coefficients 208 may be directly applicable to only a single sampling rate of the ADC 106. The coefficient storage 202 may provide storage for the coefficients 208 using any of a variety of data storage or memory technologies. For example, the coefficient storage 202 may include fusible link technology, anti-fuse technology, FLASH memory cell technology, or other data storage technology suitable to record the coefficients 208. The coefficient storage 202 is coupled to the coefficient transformation circuitry 204.

The coefficient transformation circuitry 204 retrieves the coefficients 208 from coefficient storage 202 and applies a transform to the coefficients 208 to produce the coefficients needed to correct non-linearity in the digital samples 108 received from the ADC 106. The coefficient transformation circuitry 204 may multiply the coefficients 208 by a transformation matrix to produce the coefficients applied to the digital samples 108. Parameters used to generate the transformation matrix may be provided to the coefficient transformation circuitry 204 by the control circuitry 104 as TRANSFORM CONTROL. The coefficient transformation circuitry 204 provides the transformed coefficients to the non-linear correction circuitry 206. Some embodiments of the coefficient transformation circuitry 204 may include a processor, such as a general-purpose microprocessor, a digital signal processor, a microcontroller, or other instruction execution device, and instructions executable by the processor to generate the transformation matrix and apply the transformation matrix to generate the coefficients needed to correct non-linearity in the digital samples received from the ADC 106 from the coefficients 208. Some embodiments of the coefficient transformation circuitry 204 may be implemented using dedicated hardware circuitry (e.g., dedicated digital circuitry).

The non-linearity correction circuitry 206 applies the transformed coefficients received from the coefficient transformation circuitry 204 to correct non-linearity in the digital samples 108. Embodiments of the non-linearity correction circuitry 206 may apply the transformed coefficients as per equation (1) to produce non-linearity corrected samples. Some embodiments of the non-linearity correction circuitry 206 may include a processor, such as a general-purpose microprocessor, a digital signal processor, a microcontroller, or other instruction execution device, and instructions executable by the processor to apply the coefficients received from the coefficient transformation circuitry 204 to the digital samples 108. Some embodiments of the non-linearity correction circuitry 206 may be implemented using dedicated hardware circuitry (e.g., dedicated digital circuitry).

In some embodiments of the non-linearity correction system 102, the non-linearity correction circuitry 206, the coefficient transformation circuitry 204, and the coefficient storage 202 are integrated on a single device. In some embodiments, the non-linearity correction circuitry 206, the coefficient transformation circuitry 204, and the coefficient storage 202 may be provided two or more different devices. For example, the coefficient transformation circuitry 204 may be disposed on a first device and non-linearity coefficients transferred from the first device to a second device that contains the non-linearity correction circuitry 206 for use in correcting the output of the ADC 106.

FIG. 3 shows coefficient transformation circuitry 204 in accordance with various embodiments. The coefficient transformation circuitry 204 retrieves the coefficients 208 from coefficient storage 202 and applies a transform to the coefficients 208 to produce the coefficients needed to correct non-linearity in the digital samples 108 received from the ADC 106. The coefficients 208 correspond to an ADC sampling frequency $f_{S0}$. Transform control information received from the control circuitry 104 includes $f_{S0}$, the operating sampling rate ($f_S$) of the ADC 106, the frequency band (BAND) of the digital samples 108 to be non-linearity corrected, and a number non-linearity terms (NL TERMS or terms) to be applied to the digital samples 108. The coefficient transformation circuitry 204 determines the coefficients at sampling rate $f_S$ from the coefficients at the sampling rate $f_{S0}$. The transformation assumes that non-linearity behavior of the ADC 106 is independent of sampling rate. The coefficient transformation circuitry 204 computes the transformed coefficients as:

$$C(f_S)=\tau(C(f_{S0}),f_S,f_{S0},f_1,f_h,\text{terms}) \quad (2)$$

where:

$\tau$ is the coefficient transformation function;

$f_1$ and $f_h$ are respectively the lower and higher edge frequencies of the band of interest; and C is the column vector of non-linearity coefficients 108 (which are the weights of the NL terms) as a function of the sampling rate.

Representing the coefficient transformation $\tau$ as a matrix multiplication:

$$C(f_S)=TC(f_{S0}) \quad (3)$$

where T is the transformation matrix, embodiments formulate the level of the non-linearity spurs as a linear combination of the non-linearity coefficients. The weights of the coefficients change with sampling rate, but results of the linear combination that is the spur level are constant. Where $H_0$ and $H_1$ are each matrices representative of non-linearity response of the ADC 106 at a sampling frequency, given a linear combination ($H_0$) of the non-linearity coefficients at sampling frequency $f_{S0}$ and a linear combination ($H_1$) of the non-linearity coefficients at sampling frequency $f_S$, the transformation matrix T is computed as the product of $H_0$ and the pseudoinverse of $H_1$:

$$T=\text{pinv}(H_1)H_0 \quad (4)$$

In some embodiments of the non-linearity correction system 102, the transformation matrices applied to generate non-linearity coefficients are stored in the coefficient transformation circuitry 204 or memory accessed by the coefficient transformation circuitry 204. In some embodiments of the non-linearity correction system 102, the non-linearity response matrices ($H_x$) are derived by the coefficient transformation circuitry 204 and the transformation matrices are computed as per equation (4) and further described below.

Generation of the non-linearity response matrices $H_0$ and $H_1$, and the transformation matrix T is now described in further detail. When tones are input to a non-linear device, such as the ADC 106, non-linearity spurs are produced. For example, when 2 tones at $f_1$ and $f_2$ are input to a non-linear device having third order non-linearity spurs are produced at $3f_1$, $3f_2$, $2f_1-f_2$, $2f_2-f_1$, $2f_1+f_2$, and $2f_2+f_1$. The level and phase of these spurs relative to the level and phase of input tones determine the non-linearity response.

If the ADC 106 operating at $f_{S0}$, for a tone at frequency f in the band of interest, normalized ($\omega$) is defined as:

$$\omega=2\pi f/f_s \quad (5)$$

As an example, using a third non-linearity model comprising of 3 terms, namely $x^3(n)$, $x(n)x(n-1)x(n-2)$, and $x^2(n)x'(n)$, then the non-linearity response at $3\omega$ when a tone at w with amplitude A is input can be written as:

$$\text{NLResp}@3f=A^3[c_1+c_2e^{-j3\omega}+c_3j\omega] \quad (6)$$

where $c_1$, $c_2$, and $c_3$ are the coefficients of the terms $x^3(n)$, $x(n)x(n-1)x(n-2)$, and $x^2(n)x'(n)$ respectively.

Similarly, when 2 tones and 3 tones are input, the non-linearity response (at each non-linearity spur) can be written as a linear combination of the coefficients ($c_1$, $c_2$, $c_3$) where the weights of the coefficients are a function of the non-linearity terms being used and the sampling frequency ($f_s$). Thus, for tones covering the band of interest, a system of linear equations of the coefficients is generated. In matrix form this system of equations can be written as:

$$H\vec{C}=\vec{R} \quad (7)$$

where $\vec{C}$ is a vector of coefficients, $\vec{R}$ is a vector of the non-linearity response, and the weight matrix (H) is a function of the sampling rate for a given non-linearity model.

For 2 different sampling rates $f_{s0}$ and $f_{s1}$, to find the coefficients at $f_{s1}$ given coefficients at $f_{s0}$ the non-linearity response is equated, $$H_1 \vec{C}_1 = H_0 \vec{C}_0 \qquad (8)$$

$$\Rightarrow \vec{C}_1 = \text{pinv}(H_1) H_0 \vec{C}_0 \qquad (8)$$

$$\Rightarrow \text{Define } T = \text{pinv}(H_1) H_0 \qquad (10)$$

where, $C_0$, $C_1$ are the coefficient vectors at $f_{s0}$ and $f_{s1}$ respectively and $H_0$, $H_1$ are the weight matrices at $f_{s0}$ and $f_{s1}$ respectively.

The number of rows in $H_0$ is equal to the number of equations where each equation corresponds to a specific non-linearity response. The number of columns is equal to the number of coefficients. The number of rows should typically be the same or greater than the number of columns. "T" is the transformation matrix used to generate coefficients at sampling rate $f_{s1}$ from coefficients at sampling rate $f_{s0}$. It is expected that the non-linearity response covers the band of interest by choosing a sufficient number of frequencies for single tone, two tone, and three tones signal types. Embodiments of the coefficient transformation circuitry 204 may derive the Hx matrices as described and/or apply Hx matrices to produce a transformation matrix (T). Systems external to the coefficient transformation circuitry 204 may derive the Hx matrices and/or the transformation matrix (T) and provide the Hx matrices or the transformation matrix (T) to the coefficient transformation circuitry 204 for use in generating non-linearity coefficients.

FIG. 4 shows application of the transformation matrix T in the coefficient transformation circuitry 204 to produce the coefficients for correcting non-linearity in digital samples 108 produced by the ADC 106 at sampling frequency $f_S$ from coefficients 208 for digital samples at sampling frequency $f_{S0}$.

The ADC 106 may produce digital samples 108 corresponding one of multiple Nyquist zones. For example, with the ADC 106 undersampling may be used to reflect data from a higher Nyquist zone into a lower Nyquist zone. Given a set of non-linearity coefficients 208 corresponding to a sampling frequency $f_{S0}$, the Nyquist zones relevant to the coefficients may not coincide with the operational Nyquist zones of the ADC 106. FIG. 5 shows multiple Nyquist zones of the ADC 106 and a band of interest with multiple overlapping Nyquist zones corresponding to the sampling frequency $f_{S0}$. In FIG. 5, the band of interest is wholly within a Nyquist zone of the ADC 106, but spans two Nyquist zones with respect to $f_{S0}$. As a result coefficient transformation using coefficients 208 corresponding to sampling frequency $f_{S0}$ is problematic. As a result of overlapping Nyquist zones corresponding to sampling frequency $f_{S0}$, NL coefficients for this band cannot be represented.

To overcome the issue of a band of interest overlapping two Nyquist zones, embodiments of the non-linearity correction system 102 may provide the coefficients 208 as representing non-linearity response over all possible frequency bands supported by the ADC 106 at a virtual sampling rate $f_{SV}$ where $f_{SV} > 2B$ and B is the maximum frequency supported by the ADC 106. Such embodiments of the non-linearity correction system 102 use a larger number of non-linearity terms to represent the complete non-linearity response, however, non-linearity correction may use only a required lesser number of non-linearity terms.

FIG. 6 shows coefficient transformation circuitry 204 in accordance with various embodiments. The coefficient transformation circuitry 204 retrieves the coefficients 208 from coefficient storage 202 and applies a transform to the coefficients 208 to produce the coefficients needed to correct non-linearity in the digital samples received from the ADC 106. The coefficients 208 correspond to a virtual sampling frequency $f_{SV}$. Transform control information received from the control circuitry 104 includes $f_{SV}$, the operating sampling rate ($f_S$), the frequency band (BAND) of the digital samples 108 to be non-linearity corrected, and a set of non-linearity terms at the virtual sampling frequency (NL TERMS AT $f_{SV}$ or termsfsv), and a set of non-linearity terms at the operating sampling frequency (NL TERMS AT $f_S$ or termsfs). The number of non-linearity terms at the virtual sampling frequency may be greater than the number of non-linearity terms at the operating sampling frequency. The coefficient transformation circuitry 204 determines the coefficients at sampling rate $f_S$ from the coefficients at the sampling rate $f_{SV}$. The coefficient transformation circuitry 204 computes the transformed coefficients as:

$$C(f_S) = \Sigma(C(f_{SV}), f_S, f_{SV}, f_l, f_h, \text{terms}_{f_S}, \text{terms}_{f_{sv}}) \qquad (11)$$

where:
  τ is the coefficient transformation function;
  $f_l$ and $f_h$ are respectively the lower and higher edge frequencies of the band of interest; and
  C is the column vector of non-linearity coefficients (which are the weights of the NL terms) as a function of the sampling rate. The length of the column vector is the number of terms and hence could be different for $f_{SV}$ and $f_S$.

In some applications, the signal conversion bandwidth of the ADC 106 may vary. For example, the signal conversion bandwidth of the ADC 106 may be wide or narrow in radio frequency applications. To support wideband use, the coefficients 208 may support the entire width of a Nyquist zone. Wideband non-linearity correction requires a larger number of non-linearity terms than narrowband non-linearity correction. Embodiments of the non-linearity correction system 102 may apply fewer terms to correct non-linearity in narrowband data than are applied to correct non-linearity in wideband data. Accordingly, the coefficient transformation circuitry 204 may produce fewer non-linearity coefficients, via transformation, for correction of narrowband data than are produced for wideband data. Reducing the number of terms applied by the non-linear correction circuitry 206 reduces the overall power consumption of the non-linearity correction system 102.

FIG. 7 shows coefficient transformation circuitry 204 in accordance with various embodiments. The coefficient transformation circuitry 204 retrieves the coefficients 208 from coefficient storage 202 and applies a transform to the coefficients 208 to produce the coefficients needed to correct non-linearity in the digital samples received from the ADC 106. The coefficients 208 are for wideband data and correspond to the band encompassed by an entire Nyquist zone. Transform control information received from the control circuitry 104 includes the operating sampling rate ($f_S$), the frequency band (BAND) of the digital samples 108 to be non-linearity corrected, a number non-linearity terms for wideband data (NL TERMS FOR WIDEBAND or termsWb), and a number of non-linearity terms for narrowband data (NL TERMS FOR NARROWBAND or termsNB). The number of non-linearity terms for wideband data may be greater than the number of non-linearity terms for narrowband data. The coefficient transformation circuitry 204 determines the coefficients for narrowband data at sampling rate $f_S$ as:

$$C(NB) = \tau(C(WB), f_S, f_l, f_h, \text{terms}_{WB}, \text{terms}_{NB}) \qquad (12)$$

where:

τ is the coefficient transformation function;

$f_l$ and $f_h$ are respectively the lower and higher edge frequencies of the band of interest; and C is the column vector of non-linearity coefficients (which are the weights of the corresponding NL terms) as a function of the sampling rate.

FIG. 8 shows third harmonic distortion performance using a non-linearity correction system 102 that applies transformed wideband coefficients to correct non-linearity in a narrow band as described with respect to the coefficient transformation circuitry 204 of FIG. 7.

Figure 9:
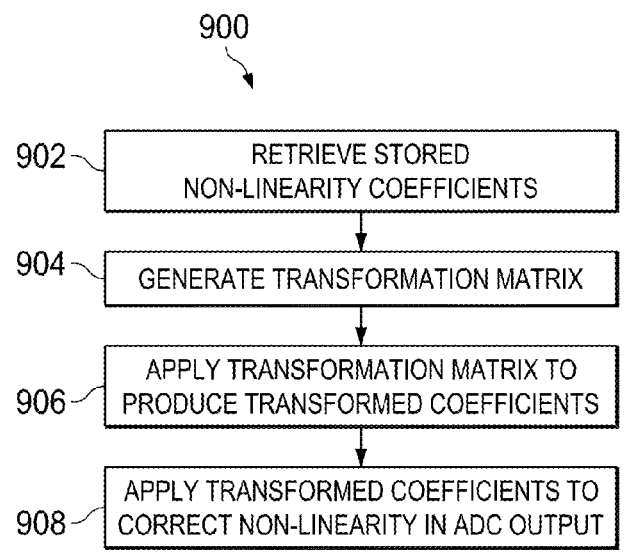
FIG. 9 shows a flow diagram for a method for non-linearity correction in accordance with various embodiments.

FIG. 9 shows a flow diagram for a method 900 for non-linearity correction in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 900 can be performed by the circuitry of the non-linearity correction system 102.

In block 902, the coefficient transformation circuitry 204 receives the coefficients 208 from the coefficient storage 202. The coefficients 208 may be directed to correction of non-linearity in digital samples 108 produced by the ADC 106 at a single given sampling frequency. The digital samples 108 to be processed by the method 900 are produced by the ADC 106 at a sampling frequency that is different from the single given sampling frequency corresponding to the coefficients 208. In some embodiments, the coefficients 208 may correspond to a virtual sampling frequency that is at least twice the maximum frequency supported by the ADC 106. Such embodiments include a large number of coefficients to represent the complete non-linearity response. In some embodiments, the coefficients 208 are for wideband data and correspond to the band encompassed by an entire Nyquist zone of the ADC 106. Such embodiments may also include a relatively large number of coefficients.

In block 904, the coefficient transformation circuitry 204 generates a transformation matrix for derivation of the coefficients to be applied to the digital samples 108 received from the ADC 106. The coefficient transformation circuitry 204 may generate the transformation matrix as described herein with respect to equation (4).

In block 906, the coefficient transformation circuitry 204 performs a matrix multiplication of coefficients 208 and the transformation matrix produced in block 904. The product of the multiplication is transformed coefficients that can be applied to correct non-linearity in the digital samples 108. The coefficient transformation circuitry 204 may produce the transformed coefficients to correct non-linearity in a band that is narrower than and within the band represented by the coefficients 208. The coefficient transformation circuitry 204 provides the transformed coefficients to the non-linearity correction circuitry 206.

In block 908, the non-linearity correction circuitry 206 applies the transformed coefficients to correct non-linearity in the digital samples 108 received from the ADC 106. In some embodiments, the number of transformed coefficients applied to correct non-linearity is a function of the bandwidth of interest in the digital samples 108. Accordingly, the number of terms, and corresponding number of coefficients, applied by the non-linearity correction circuitry 206 may be reduced with bandwidth, with commensurate reduction in the power consumed by the non-linearity correction circuitry 206 to correct non-linearity in the digital samples 108.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A non-linearity correction system for an analog-to-digital converter (ADC), the system comprising:
coefficient storage encoded with a first set of coefficients for correcting non-linearity of the ADC at a first sampling rate;
coefficient transformation circuitry coupled to the coefficient storage, the coefficient transformation circuitry configured to generate a second set of coefficients for correcting non-linearity of the ADC at a different sampling rate; and
correction circuitry configured to apply the second set of coefficients to correct non-linearity in an output of the ADC while the ADC is operating at the different sampling rate;
wherein:
the first set of coefficients is for correcting the non-linearity of the ADC for a predetermined band of signal; and
the coefficient transformation circuitry is configured to generate the second set of coefficients for a different band of the signal.

2. The system of claim 1, wherein the different band is narrower than and within the predetermined band, and the coefficient transformation circuitry is configured to generate the second set of coefficients for fewer than a number of terms corresponding to the first set of coefficients based on the second band being narrower than and within the predetermined band.

3. A non-linearity correction system for an analog-to-digital converter (ADC), the system comprising:
coefficient storage encoded with a first set of coefficients for correcting non-linearity of the ADC at a first sampling rate;
coefficient transformation circuitry coupled to the coefficient storage, the coefficient transformation circuitry configured to generate a second set of coefficients for correcting non-linearity of the ADC at a different sampling rate; and
correction circuitry configured to apply the second set of coefficients to correct non-linearity in an output of the ADC while the ADC is operating at the different sampling rate;
wherein the coefficient transformation circuitry is configured to multiply the first set of coefficients by a transformation matrix to generate the second set of coefficients.

4. A non-linearity correction system for an analog-to-digital converter (ADC), the system comprising:
coefficient storage encoded with a first set of coefficients for correcting non-linearity of the ADC at a first sampling rate;
coefficient transformation circuitry coupled to the coefficient storage, the coefficient transformation circuitry configured to generate a second set of coefficients for correcting non-linearity of the ADC at a different sampling rate; and correction circuitry configured to apply the second set of coefficients to correct non-linearity in an output of the ADC while the ADC is operating at the different sampling rate;
wherein the first set of coefficients is selected for a virtual sampling rate that is at least twice the maximum frequency convertible by the ADC.

5. A non-linearity correction system for an analog-to-digital converter (ADC), the system comprising:
coefficient storage encoded with a first set of coefficients for correcting non-linearity of the ADC at a first sampling rate;
coefficient transformation circuitry coupled to the coefficient storage, the coefficient transformation circuitry configured to generate a second set of coefficients for correcting non-linearity of the ADC at a different sampling rate; and
correction circuitry configured to apply the second set of coefficients to correct non-linearity in an output of the ADC while the ADC is operating at the different sampling rate;
wherein the first set of coefficients is selected for use across each of a plurality of Nyquist bands supported by the ADC.

6. The system of claim 5, wherein the coefficient transformation circuitry is configured to generate the second set of coefficients for fewer than a number of terms corresponding to the first set of coefficients.

7. A non-linearity correction system for an analog-to-digital converter (ADC), the system comprising:
coefficient storage encoded with a first set of coefficients for correcting non-linearity of the ADC at a first sampling rate;
coefficient transformation circuitry coupled to the coefficient storage, the coefficient transformation circuitry configured to generate a second set of coefficients for correcting non-linearity of the ADC at a different sampling rate; and
correction circuitry configured to apply the second set of coefficients to correct non-linearity in an output of the ADC while the ADC is operating at the different sampling rate;
further comprising control circuitry coupled to the coefficient transformation circuitry, the control circuitry configured to communicate to the coefficient transformation circuitry one or more parameters selected from the different sampling rate, a number of terms corresponding to the second set of coefficients, or a band of signal to be processed using the second set of coefficients.

8. The system of claim 7, wherein the coefficient transformation circuitry is configured to:
generate a transformation matrix based on the one or more parameters; and
multiply the first set of coefficients by the transformation matrix to generate the second set of coefficients.

9. Analog-to-digital conversion circuitry, comprising:
an analog-to-digital converter (ADC); and
a non-linearity correction circuit coupled to an output of the ADC, the non-linearity correction circuit comprising:
coefficient storage encoded with a first set of coefficients for correcting non-linearity of the ADC at a first sampling rate;
coefficient transformation circuitry coupled to the coefficient storage, the coefficient transformation circuitry configured to:
retrieve the first set of coefficients from the coefficient storage; and
process the first set of coefficients to generate a second set of coefficients for correcting non-linearity of the ADC at a second sampling rate; and
correction circuitry configured to apply the second set of coefficients to correct non-linearity in output of the ADC while the ADC is operating at the second sampling rate;
wherein:
the first set of coefficients is for correcting the non-linearity of the ADC for a predetermined band of signal; and
the coefficient transformation circuitry is configured to generate the second set of coefficients for a different band of the signal with the band being within the predetermined band.

10. The analog-to-digital conversion circuitry of claim 9, wherein the different band is narrower than and within the predetermined bandwidth, and the coefficient transformation circuitry is configured to generate the second set of coefficients for fewer than a number of terms corresponding to the first set of coefficients based on the second band being narrower than and within the predetermined band.

11. Analog-to-digital conversion circuitry, comprising:
an analog-to-digital converter (ADC); and
a non-linearity correction circuit coupled to an output of the ADC, the non-linearity correction circuit comprising:
coefficient storage encoded with a first set of coefficients for correcting non-linearity of the ADC at a first sampling rate;
coefficient transformation circuitry coupled to the coefficient storage, the coefficient transformation circuitry configured to:
retrieve the first set of coefficients from the coefficient storage; and
process the first set of coefficients to generate a second set of coefficients for correcting non-linearity of the ADC at a second sampling rate; and
correction circuitry configured to apply the second set of coefficients to correct non-linearity in output of the ADC while the ADC is operating at the second sampling rate;
wherein the coefficient transformation circuitry is configured to multiply the first set of coefficients by a transformation matrix to generate the second set of coefficients.

12. Analog-to-digital conversion circuitry, comprising:
an analog-to-digital converter (ADC); and
a non-linearity correction circuit coupled to an output of the ADC, the non-linearity correction circuit comprising:
coefficient storage encoded with a first set of coefficients for correcting non-linearity of the ADC at a first sampling rate;
coefficient transformation circuitry coupled to the coefficient storage, the coefficient transformation circuitry configured to:
retrieve the first set of coefficients from the coefficient storage; and
process the first set of coefficients to generate a second set of coefficients for correcting non-linearity of the ADC at a second sampling rate; and correction circuitry configured to apply the second set of coefficients to correct non-linearity in output of the ADC while the ADC is operating at the second sampling rate;

wherein the first set of coefficients is selected for a virtual sampling rate that is at least twice the maximum sampling rate of the ADC.

13. Analog-to-digital conversion circuitry, comprising:
an analog-to-digital converter (ADC); and
a non-linearity correction circuit coupled to an output of the ADC, the non-linearity correction circuit comprising:
   coefficient storage encoded with a first set of coefficients for correcting non-linearity of the ADC at a first sampling rate;
   coefficient transformation circuitry coupled to the coefficient storage, the coefficient transformation circuitry configured to:
      retrieve the first set of coefficients from the coefficient storage; and
      process the first set of coefficients to generate a second set of coefficients for correcting non-linearity of the ADC at a second sampling rate; and
   correction circuitry configured to apply the second set of coefficients to correct non-linearity in output of the ADC while the ADC is operating at the second sampling rate;
wherein the first set of coefficients is selected for use across a plurality of Nyquist bands supported by the ADC.

14. Analog-to-digital conversion circuitry, comprising:
an analog-to-digital converter (ADC); and
a non-linearity correction circuit coupled to an output of the ADC, the non-linearity correction circuit comprising:
   coefficient storage encoded with a first set of coefficients for correcting non-linearity of the ADC at a first sampling rate;
   coefficient transformation circuitry coupled to the coefficient storage, the coefficient transformation circuitry configured to:
      retrieve the first set of coefficients from the coefficient storage; and
      process the first set of coefficients to generate a second set of coefficients for correcting non-linearity of the ADC at a second sampling rate; and
   correction circuitry configured to apply the second set of coefficients to correct non-linearity in output of the ADC while the ADC is operating at the second sampling rate;
wherein the coefficient transformation circuitry is configured to generate the second set of coefficients for fewer than a number of terms corresponding to the first set of coefficients.

15. Analog-to-digital conversion circuitry, comprising:
an analog-to-digital converter (ADC); and
a non-linearity correction circuit coupled to an output of the ADC, the non-linearity correction circuit comprising:
   coefficient storage encoded with a first set of coefficients for correcting non-linearity of the ADC at a first sampling rate;
   coefficient transformation circuitry coupled to the coefficient storage, the coefficient transformation circuitry configured to:
      retrieve the first set of coefficients from the coefficient storage; and
      process the first set of coefficients to generate a second set of coefficients for correcting non-linearity of the ADC at a second sampling rate; and
   correction circuitry configured to apply the second set of coefficients to correct non-linearity in output of the ADC while the ADC is operating at the second sampling rate;
   further comprising control circuitry coupled to the coefficient transformation circuitry, the control circuitry configured to communicate to the coefficient transformation circuitry one or more parameters selected from the different sampling rate, a number of terms corresponding to the second set of coefficients, or a band of signal to be processed using the second set of coefficients.

16. The system of claim 15, wherein the coefficient transformation circuitry is configured to:
   generate a transformation matrix based on the one or more parameters; and
   multiply the first set of coefficients by the transformation matrix to generate the second set of coefficients.

17. A circuit for correcting non-linearity of an analog-to-digital converter (ADC), the circuit comprising:
   coefficient storage encoded with a first set of coefficients for correcting non-linearity of the ADC at a first sampling rate and for a first band of ADC output signal;
   coefficient transformation circuitry coupled to the coefficient storage, the coefficient transformation circuitry configured to multiply the first set of coefficients by a transformation matrix to generate a second set of coefficients for correcting non-linearity of the ADC at a second sampling rate and for a second band of ADC output signal; and
   correction circuitry configured to apply the second set of coefficients to correct non-linearity in an output of the ADC while the ADC is operating at the second sampling rate and with the second band of ADC output signal.

18. The circuit of claim 17, wherein the second band is narrower than and within the first band, and the coefficient transformation circuitry is configured to generate the second set of coefficients with fewer than a number of terms corresponding to the first set of coefficients based on the second band being narrower than and within the first band.

* * * * *